(12) United States Patent
Yang et al.

(10) Patent No.: US 8,658,531 B2
(45) Date of Patent: Feb. 25, 2014

(54) METHOD OF FORMING CONNECTION HOLES

(71) Applicant: Shanghai Huali Microelectronics Corporation, Shanghai (CN)

(72) Inventors: Yushu Yang, Shanghai (CN); Cheng Li, Shanghai (CN); Yuwen Chen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/721,070

(22) Filed: Dec. 20, 2012

(65) Prior Publication Data

US 2013/0273742 A1   Oct. 17, 2013

(30) Foreign Application Priority Data

Apr. 17, 2012   (CN) .......................... 2012 1 0114135

(51) Int. Cl.
*H01L 21/4763* (2006.01)

(52) U.S. Cl.
USPC ............................ 438/634; 438/618; 438/702

(58) Field of Classification Search
USPC ......... 438/618, 622, 624, 634, 637, 672, 702, 438/703
See application file for complete search history.

(56) References Cited

U.S. PATENT DOCUMENTS

| | | | |
|---|---|---|---|
| 6,756,321 B2 * | 6/2004 | Ko et al. | 438/778 |
| 7,335,585 B2 * | 2/2008 | Choi | 438/636 |
| 2005/0181623 A1 * | 8/2005 | Bencher et al. | 438/761 |
| 2005/0215051 A1 * | 9/2005 | Yang et al. | 438/624 |
| 2009/0130837 A1 * | 5/2009 | Huang | 438/602 |

* cited by examiner

*Primary Examiner* — Kevin M Picardat
(74) *Attorney, Agent, or Firm* — Anova Law Group, PLLC

(57) ABSTRACT

The present invention provides a method of forming connection holes. The method utilizes two different gases to perform two etching processes for the interlayer dielectric layer so as to form connection holes. The etching rate of the interlayer dielectric layer in the first etching process using the first etching gas is proportional to the size of the openings which defines the connection hole while the etching rate of the interlayer dielectric layer in the second etching process using the second etching gas is inversely related with size of the openings. According to the present invention, the first etching gas and the second etching gas compensate for each other to eliminate the loading effect, thus the connection holes are formed with almost the same depth. Therefore the damage of the etching stopper layer due to the high etching rate in the larger connection holes can be avoided, which prevents the excessive variation of the connecting resistance and expands the process window.

11 Claims, 5 Drawing Sheets ly*:
METHOD OF FORMING CONNECTION HOLES

CROSS-REFERENCE TO RELATED APPLICATION

This application claims the priority benefit of China application serial no. 201210114135.1, filed Apr. 17, 2012. All disclosure of the China application is incorporated herein by reference.

FIELD OF THE INVENTION

The present invention relates to the field of semiconductor manufacturing technology, and particularly to a method of forming connection holes.

BACKGROUND OF THE INVENTION

The process of forming connection holes in the dielectric layer by etching and subsequently depositing conductive materials in the connection holes is widely used in the semiconductor manufacturing process. The connection holes can be used in the electric connection with the gate electrode, the source electrode and the drain electrode, the electric connection between the dielectric layers and the electric connection in the back-end package process.

FIGS. 1 to 4 illustrate a conventional method of forming connection holes in the back-end aluminum interconnection process. Referring to FIG. 1, the method comprises providing a semiconductor substrate with a metal layer 101 on the surface thereof; forming an etching stopper layer 102, a first DARC (dielectric anti-reflective coating) layer 103, an interlayer dielectric layer 104 and a second DARC layer 105 successively on the surface of the metal layer 101; forming a photoresist pattern 106 on the second DARC layer 105, wherein the openings of the photoresist pattern define the connection holes; referring to FIG. 2, etching the second DARC layer 105 using the photoresist pattern as a mask until exposing the interlayer dielectric layer 104; afterwards, as shown in FIG. 3, continue to etching the interlayer dielectric layer 104 until exposing the first DARC layer 103; then applying over-etching and stopping on the etching stopper layer 102. In the method of forming connection holes mentioned above, for example, the material of the metal layer 101 is Al (aluminum), the material of the etching stopper layer 102 is TiN (titanium nitride), the material of the first DARC layer 103 and the second DARC layer 105 is SiON (silicon oxynitride), and the material of the interlayer dielectric layer 104 is SiOX (silicon oxide). The etching is a plasma etching.

Generally, more than one connection holes are required to form in the interlayer dielectric layer 104 and the diameters of the connection holes may differs according to the process design. Due to the loading effect during the plasma etching, the reactive species which cause the etching reaction may enter into the bottom of the openings of various sizes with different difficulty levels, which leads to the different etching rates in the connection holes. Specifically, the connection holes having smaller diameters make it difficult for the reactive species to get into the bottom thereof and the etching rate therein is low, while the connection holes having larger diameters make it easy for the reactive species to get into the bottom thereof and the etching rate therein is high. When the etching process is applied to the connection holes with great differences in diameter (such as three to four folds), the connection holes having larger diameters may even extend through the etching stopper layer (TiN) 102 to expose the metal layer 101, which causes the great variations of the connecting resistance and affects the performance of the back-end wirings.

SUMMARY OF THE INVENTION

Accordingly, at least one objective of the present invention is to provide a method of forming connection holes to overcome the defects of the excessive etching rate in larger connection holes due to the different etching degrees in the connection holes having different diameters during the formation of the connection holes so as to improve the component performance.

To achieve these and other advantages and in accordance with the objective of the invention, as embodied and broadly described herein, the invention provides a method of forming connection holes comprising:

providing a semiconductor substrate having a metal layer on the surface thereof;

forming an etching stopper layer, a first dielectric anti-reflective coating layer, an interlayer dielectric layer and a second dielectric anti-reflective coating layer successively on the surface of the metal layer;

forming a photoresist pattern on the second dielectric anti-reflective coating layer, wherein the openings of the photoresist pattern are different in size;

etching the second dielectric anti-reflective coating layer using the photoresist pattern as a mask until exposing the interlayer dielectric layer;

performing a first etching process to the interlayer dielectric layer by using a first etching gas to form multiple openings of different sizes, and stopping the first etching process when the first dielectric anti-reflective coating layer is exposed through the opening of the maximum size;

performing a second etching process to the interlayer dielectric layer using a second etching gas, and stopping the second etching process when the first dielectric anti-reflective coating layer is exposed through the opening of the minimum size;

performing over-etching to remove the residual first dielectric anti-reflective coating layer until exposing the etching stopper layer through all the openings so as to form the connection holes having different diameters.

In the above method, the etching rate of the first etching gas in the interlayer dielectric layer is proportional to the size of the opening during the first etching process while the etching rate of the second etching gas in the interlayer dielectric layer is inversely related with the size of the opening during the second etching process.

The invention utilizes two different gases to perform two etching processes to the interlayer dielectric layer in which a loading effect and an anti-loading effect occurs respectively to compensate for each other to form the connection holes:

The first etching gas generates fewer polymers during the first etching process, and the etching rate in the larger opening is greater than that in the smaller opening, the first etching gas is used for etching the most part of the interlayer dielectric layer. When the opening of the maximum size exposes the first dielectric anti-reflective coating layer, the first etching process is stopped. At that time, the small openings will not expose the first dielectric anti-reflective coating layer since the etching rate in the small opening is relative low.

The second etching gas generates more polymers during the second etching process, and the etching rate is inversely related with the opening size. Since the etching rate in the smaller openings is greater than that in the larger openings, and the etching selection ratio of the second etching gas between the interlayer dielectric layer and the first dielectric anti-reflective coating layer is high, only little over etching occurs in the first dielectric anti-reflective coating layer exposed through the large opening when the small opening exposes the first dielectric anti-reflective coating layer. Therefore, the etching process for the interlayer dielectric layer in the openings of different sizes can be completed at almost the same time, so as to form the connection holes with basically the same depths.

According to the method of forming connection holes, the first etching gas and the second etching gas are utilized to compensate each other to eliminate the loading effect during etching the connection holes having great difference in size, so as to form the connection holes having almost the same depths with the bottom thereof all stopped on the etching stopper layer. Therefore, the damage of the etching stopper layer due to the high etching rate in the larger connection holes can be avoided, thus to prevent the excessive variation of the connecting resistance and expand the processing window.

BRIEF DESCRIPTION OF THE DRAWINGS

The method of forming connection holes of the present invention will be elucidated by reference to the following embodiments and the accompanying drawings, in which.

DETAILED DESCRIPTION OF THE EMBODIMENTS

The invention provides a method of forming connection holes. According to the present invention, two etching gases which results in contrary loading effects are utilized to compensate for the etching effects caused by each other during the etching process, so as to control the etching depths of the connection holes of different sizes.

The method of forming connection holes of the present invention will be described in further details hereinafter with respect to the embodiments and the accompanying drawings. However, the embodiments described herein are not the only applications or uses contemplated for the invention. The specific embodiments discussed are merely illustrative of specific ways to make and use the invention, and do not limit the scope of the invention or the appended claims.

FIG. 5 to FIG. 9 are cross sectional views showing the method of forming the connection holes in the embodiment of the present invention. The method in the embodiment will be described in details as follows with respect to FIGS. 5 to 9.

Figure 1:
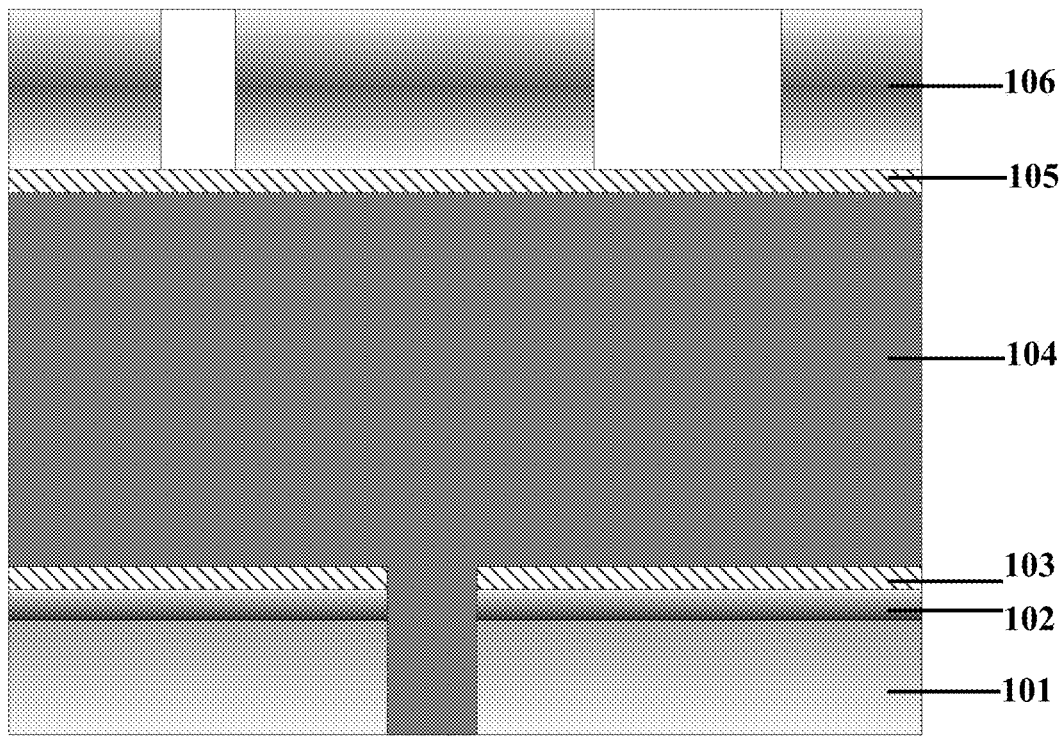
FIGS. 1 to 4 are cross sectional views showing a conventional method of forming connection holes.
Figure 2:
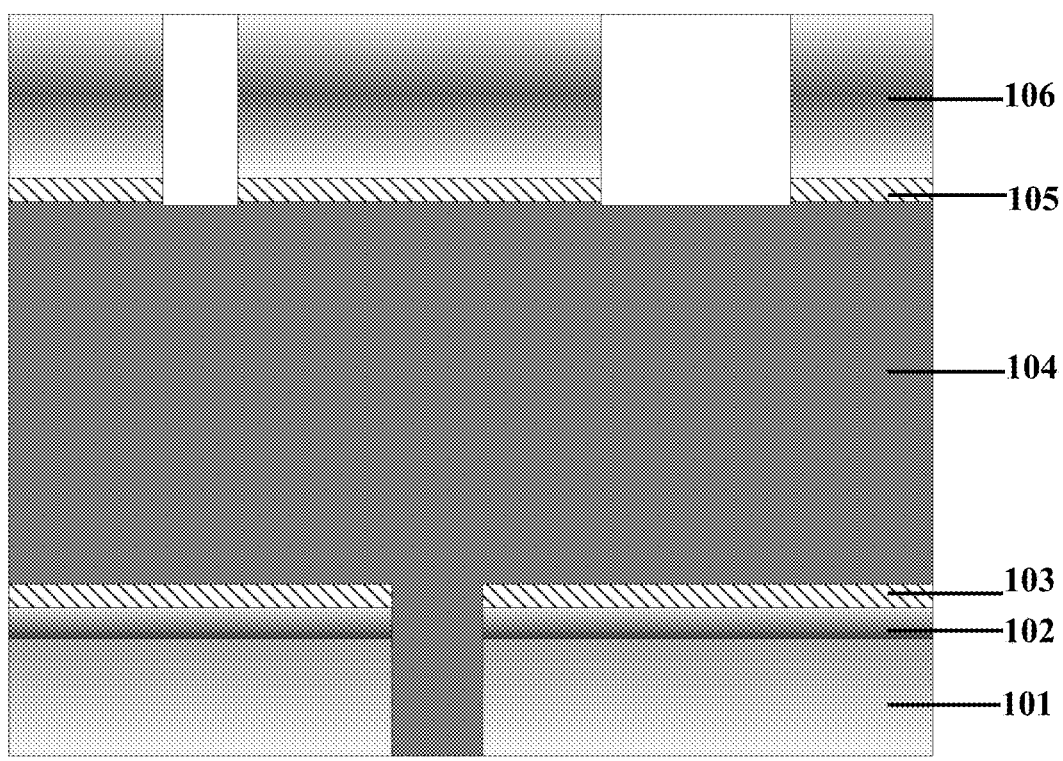
Figure 3:
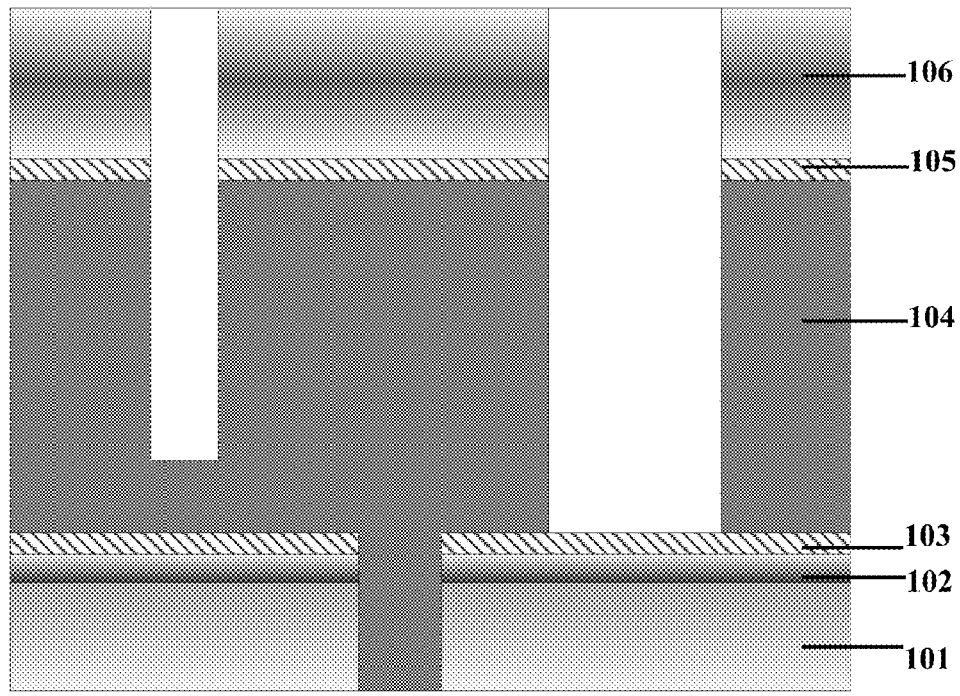
Figure 4:
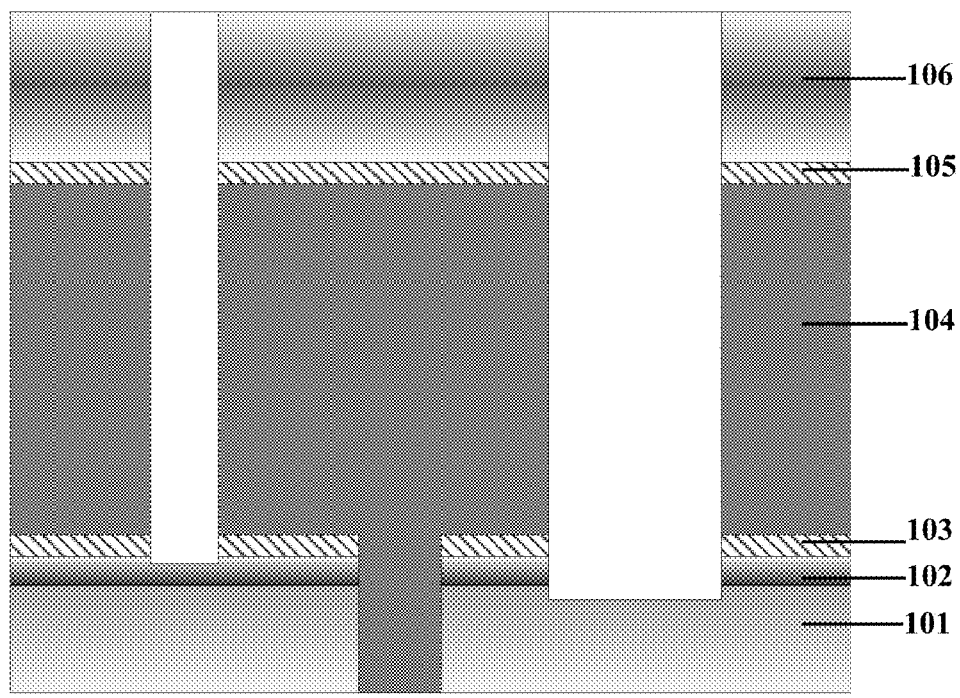
Figure 5:
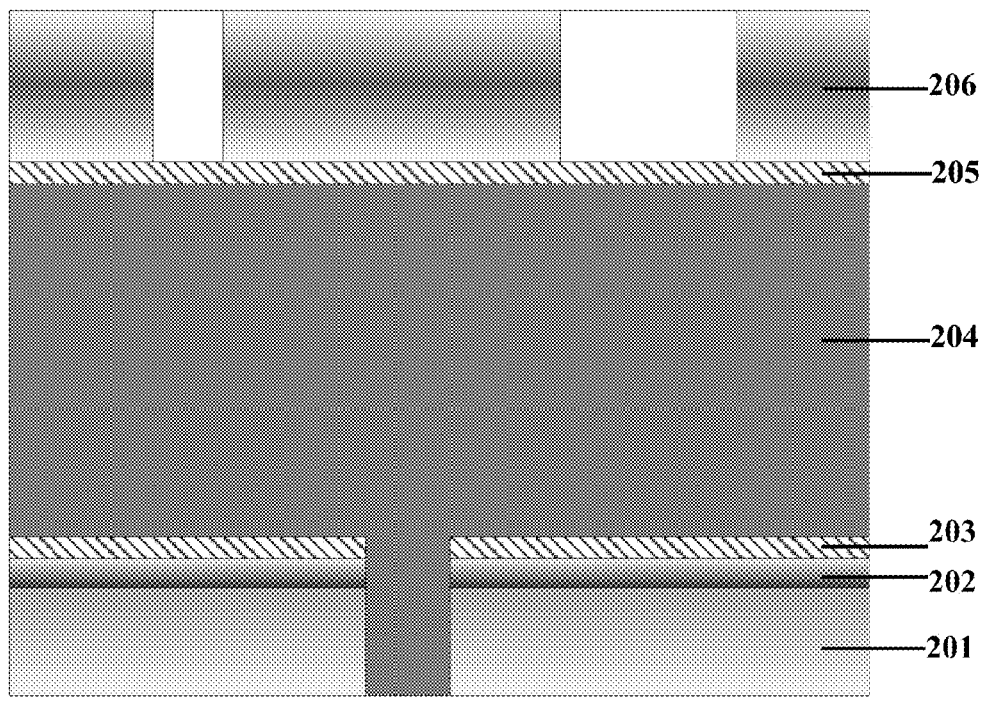
FIGS. 5 to 9 are cross sectional views showing the method of forming connection holes in one embodiment of the present invention.

Referring to FIG. 5, a semiconductor substrate is provided, a metal layer 201 is positioned on the surface of the semiconductor substrate; then an etching stopper layer 202, a first DARC (dielectric anti-reflective coating) layer 203, an interlayer dielectric layer 204, and a second DARC (dielectric anti-reflective coating) layer 205 are successively deposited on the surface of the metal layer 201; wherein the substrate can be monocrystal silicon, silicon germanium compounds, SOI (silicon on insulator) structure, or epitaxial layer on the silicon. The substrate comprises various components which may be used in the semiconductor integrated circuit manufacturing, such as MOSFETs, logic components, control components, at least one layer of interconnection structures such as plugs, vias, or trenches, and one or more compound of various metals, such as tungsten, aluminum, copper, and related alloys filled in the interconnection structures.

The material of the metal layer 201 is preferably aluminum, and can also be copper or other materials; the etching stopper layer 202 can be TiN or a composite layer of TiN and Ti to act as a diffusion barrier layer for the aluminum, a partial anti-reflective coating layer and an etching stopping layer as well; the first DARC layer 203 and the second DARC layer 205 can be SiON or SiN to prevent the reflection of the light affecting the development of the photoresist, and also acts as an etching buffer layer to adjust the depths of the etched holes and eliminate the loading effects; the material of the interlayer dielectric layer 204 can be SiOX, BSG, PSG, BPSG, etc.

The method of forming connection holes of the present invention will be described in further details hereinafter with respect to an embodiment. In the embodiment, the interlayer dielectric layer 204 is SiOX, the etching stopper layer 202 is TiN; the first DARC layer 203 and the second DARC layer 205 are SiON.

Photoresist patterns 206 are formed on the second DARC layer 205, and the openings of the photoresist patterns 206 define the connection holes to be formed subsequently. In the embodiment, the diameters of the connection holes to be formed are different according to the process design, and thus the opening sizes of the photoresist patterns 206 are different as well.

The openings shown in FIG. 5 are merely illustrative and do not limit the scope of the invention or the appended claims. In some embodiments, the size of the larger opening can be three to five times of the size of the smaller opening. In the actual manufacturing process, two or more connection holes having different diameters are required to form at the same time, the material of the interlayer dielectric layer 204 may also differs, thus the specific composition and the etching time of the first etching gas and the second etching gas will be adjusted according to the differences in the diameters of the connection holes and the materials of the interlayer dielectric layer 204. One skilled in the art will obtain the adjusting results through limited trials within the teaching of the present invention.

Figure 6:
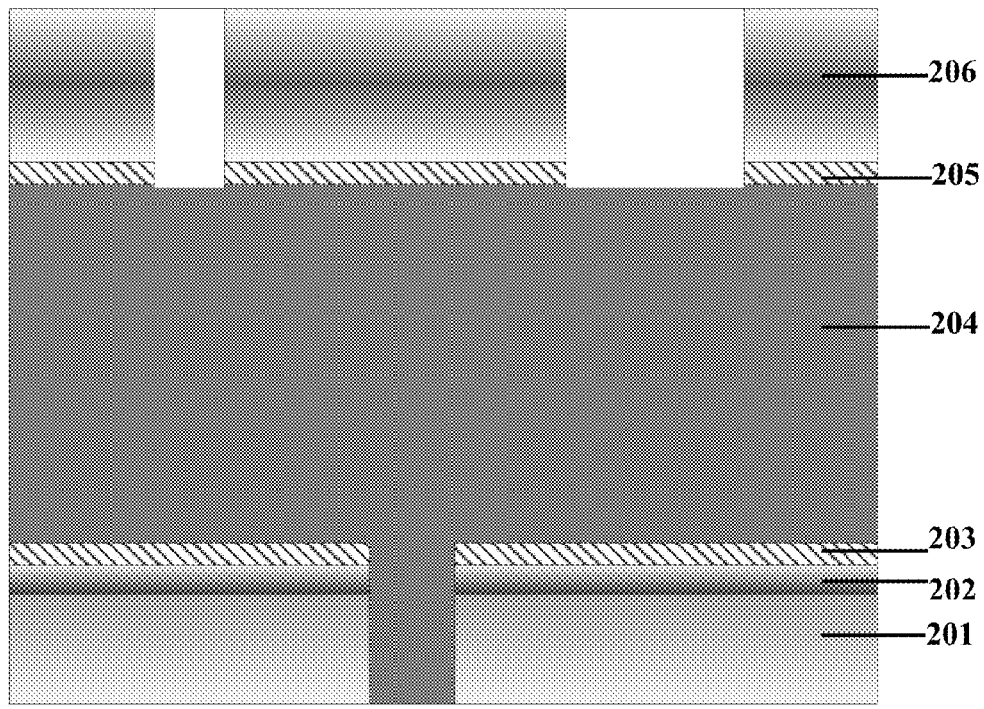

Referring to FIG. 6, the second DARC layer 205 is etched to expose the interlayer dielectric layer 204 by using the photoresist as a mask. The etching process can be performed by any means known to one skilled in the art. Preferably, in the embodiment, the second DARC layer 205 is plasma dry-etched using an etching gas comprising $CF_4$ and CHFO under conditions of a processing pressure of 30~80 mT in the process chamber, a main RF power of 500~1000 W and a bias RF power of 200~700 W.

Figure 7:
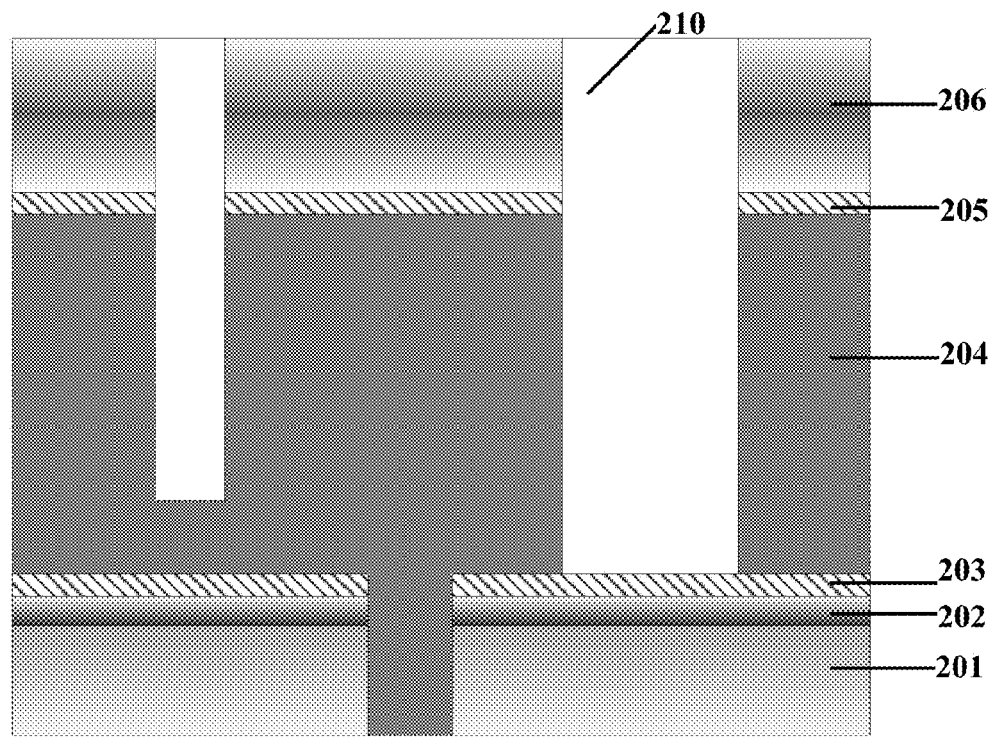

As shown in FIG. 7, the first etching process for the interlayer dielectric layer 204 is performed by using the first etching gas to form multiple openings in the interlayer dielectric layer 204, when the largest opening 210 exposes the first DARC layer 203, the etching process is stopped; wherein the diameter of the largest opening 210 is in the range of 0.8~1.2 um.

The first etching gas generates fewer polymers during the first etching process, and the etching rate is directly proportional to the opening size, thus the etching rate in the larger openings is high. When the first etching process is stopped as the largest opening 210 exposing the first DARC layer 203, the most part of the interlayer dielectric layer 204 has already been etched. At that time, due to the low etching rate in the smaller openings, the openings of small sizes still do not extend through the interlayer dielectric layer 204 to expose the first DARC layer 203.

In the embodiment, the first etching process is plasma dry-etching; the first etching gas comprises $C_4F_8$ and $CF_4$, and further comprises $O_2/Ar$; the first etching process is performed under conditions of a gas pressure of 10~30 mT in the process chamber, a main RF power of 1500~2500 W, a bias RF power of 2000~3000 W, a $C_4F_8$ flow rate of 40~50 sccm, a $CF_4$ flow rate of 15~20 sccm, an $O_2$ flow rate of 15~25 sccm, and an Ar flow rate of 600~800 sccm.

Figure 8:
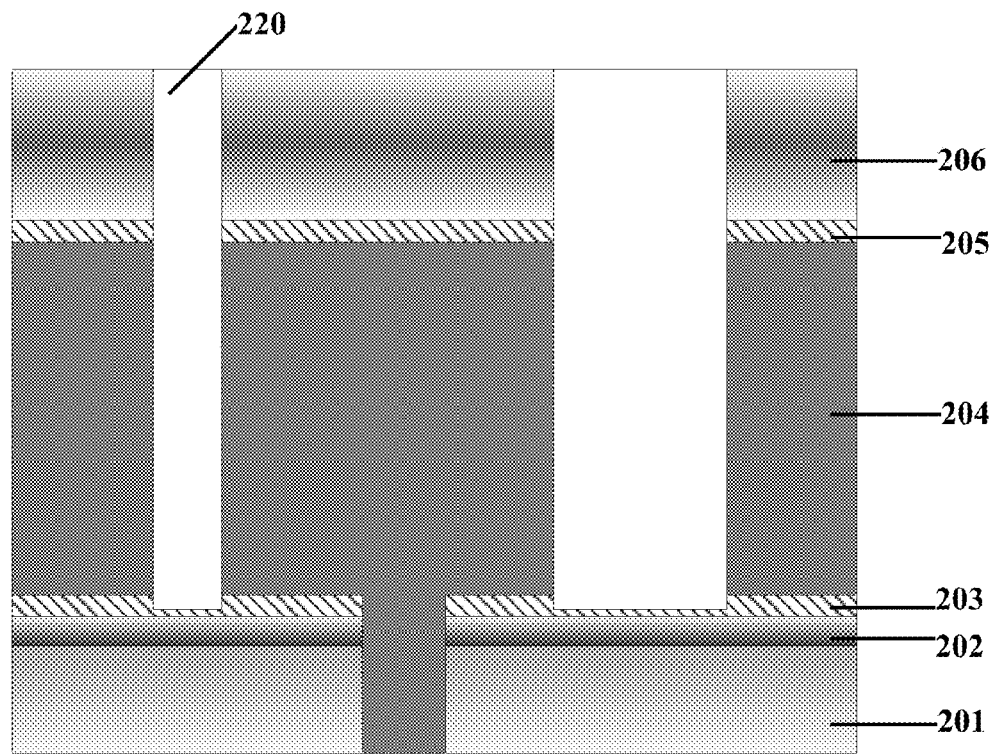

Referring to FIG. 8, the second etching process for the interlayer dielectric layer 204 is performed by using the second etching gas and is stopped when the smallest opening 220 exposes the first dielectric anti-reflective coating layer 203, wherein the diameter of the smallest opening 220 is in the range of 0.2~0.3 um.

The second etching process is performed by using the second etching gas at an etching selection ratio of 20~30:1 between the interlayer dielectric layer 204 and the first DARC layer 203.

The second etching gas generates more polymers during the second etching process, and the etching rate is inversely related with the opening size, that is, the etching rate of the second etching gas in smaller openings is higher than that in larger openings. Therefore, the interlayer dielectric layer 204 exposed through the smaller openings will be further etched in the second etching process. When the smaller opening exposes the first dielectric anti-reflective coating layer 203, the second etching process is stopped. Since the etching rate in smaller openings is higher than that in larger openings during the second etching process, only little over-etching occurs in the first DARC layer 203 exposed through the larger opening, the larger opening still stops on the first DARC layer 203. Therefore, after the second etching process, the openings of different sizes are etched with almost the same depths.

In the embodiment, the second etching process is plasma dry-etching; the second etching gas comprises $C_4F_6$, and further comprises $O_2/Ar$; the second etching process is performed under conditions of a gas pressure of 10~30 mT in the process chamber, a main RF power of 1500~2500 W, a bias RF power of 2000~3000 W, a $C_4F_6$ flow rate of 20~26 sccm, an $O_2$ flow rate of 10~18 sccm, and an Ar flow rate of 400~600 sccm.

Figure 9:
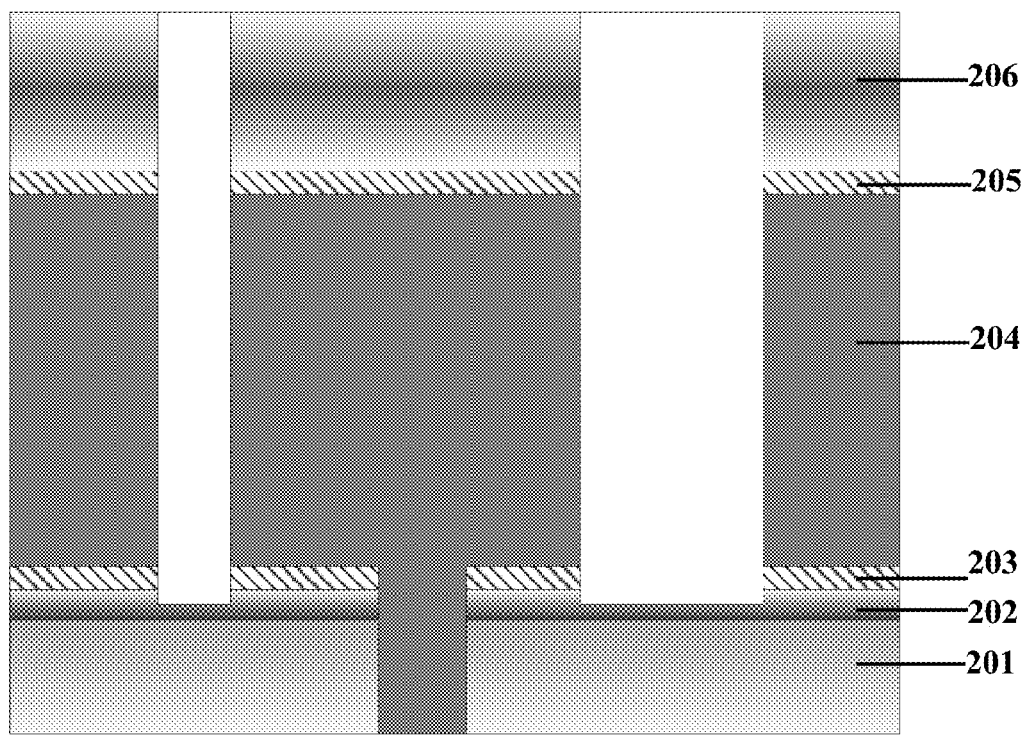

As shown in FIG. 9, the residual first DARC layer is removed by over-etching and the etching stopper layer 202 are exposed through all the openings so as to form the connection holes having different diameters.

In the embodiment, the over-etching process is plasma dry-etching; the over-etching gas comprises $C_4F_8$, and further comprises $O_2/Ar$; the over-etching process is performed under conditions of a gas pressure of 10~30 mT in the process chamber, a main RF power of 1500~2500 W, a bias RF power of 2000~3000 W, a $C_4F_8$ flow rate of 20~26 sccm, an $O_2$ flow rate of 14~24 sccm, an Ar flow rate of 600~800 sccm.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method of forming connection holes comprising:
   providing a semiconductor substrate having a metal layer on the surface thereof;
   forming an etching stopper layer, a first dielectric anti-reflective coating layer, an interlayer dielectric layer and a second dielectric anti-reflective coating layer successively on the surface of the metal layer;
   forming photoresist patterns on the second dielectric anti-reflective coating layer, wherein the openings of the photoresist pattern are different in size;
   etching the second dielectric anti-reflective coating layer using the photoresist patterns as a mask until exposing the interlayer dielectric layer;
   performing a first etching process to the interlayer dielectric layer by using a first etching gas to form multiple openings of different sizes, and stopping the first etching process when the first dielectric anti-reflective coating layer is exposed through the opening of the maximum size;
   performing a second etching process to the interlayer dielectric layer by using a second etching gas, and stopping the second etching process when the first dielectric anti-reflective coating layer is exposed through the opening of the minimum size;
   performing over-etching to remove the residual first dielectric anti-reflective coating layer until exposing the etching stopper layer through all the openings to form the connection holes having different diameters.

2. The method according to claim 1, wherein the etching rate of the first etching gas in the interlayer dielectric layer is proportional to the size of the openings while the etching rate of the second etching gas in the interlayer dielectric layer is inversely related with size of the openings.

3. The method according to claim 2, wherein the second etching process is performed by using the second etching gas at an etching selection ratio of 20~30:1 between the interlayer dielectric layer and the first dielectric anti-reflective coating layer.

4. The method according to claim 3, wherein the first etching gas comprises $C_4F_8$ and $CF_4$.

5. The method according to claim 4, wherein the first etching gas further comprises $O_2/Ar$.

6. The method according to claim 5, wherein the flow rate of $C_4F_8$ is 40~50 sccm, the flow rate of $CF_4$ is 15~20 sccm.

7. The method according to claim 3, wherein the second etching gas comprises $C_4F_6$.

8. The method according to claim 7, wherein the second etching gas further comprises $O_2/Ar$.

9. The method according to claim 8, wherein the flow rate of $C_4F_6$ is 20~26 sccm.

10. The method according to claim 1, wherein the interlayer dielectric layer is silicon oxide, the first dielectric anti-reflective layer is SiON or SiN.

11. The method according to claim 1, wherein the second dielectric anti-reflective layer is SiON or SiN, the etching stopper layer is TiN or a compound layer of TiN and Ti.

* * * * *